(12) United States Patent
Kassa et al.

(10) Patent No.: US 6,743,037 B2
(45) Date of Patent: Jun. 1, 2004

(54) SURFACE MOUNT SOCKET CONTACT PROVIDING UNIFORM SOLDER BALL LOADING AND METHOD

(75) Inventors: Kenneth E. Kassa, Gilbert, AZ (US); Vinayak Pandey, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/128,248

(22) Filed: Apr. 24, 2002

(65) Prior Publication Data

US 2003/0203660 A1 Oct. 30, 2003

(51) Int. Cl.[7] .......................... H05K 1/00; H01R 12/00
(52) U.S. Cl. ................................. 439/342; 439/65
(58) Field of Search ......................... 439/342, 65, 66

(56) References Cited

U.S. PATENT DOCUMENTS

| | | | | |
|---|---|---|---|---|
| 6,099,321 A | * | 8/2000 | McHugh et al. | 439/342 |
| 6,450,824 B1 | * | 9/2002 | Lemke et al. | 439/342 |
| 6,485,313 B1 | * | 11/2002 | Lu et al. | 439/83 |
| 6,558,182 B1 | * | 5/2003 | Ohkita et al. | 439/342 |

* cited by examiner

Primary Examiner—Michael C. Zarroli
(74) Attorney, Agent, or Firm—Schwegman, Lundberg, Woessner & Kluth, P.A.

(57) ABSTRACT

A surface mount contact to provide uniform reflow element (e.g. solder ball) loading, a method to accomplish the same, and a system embodying the same. The surface mount socket can include at least one contact with an upper end, an intermediate section and a lower end. The upper end is adapted to receive an electrical contact. The intermediate section is adapted to flex under compressive load. The lower end is adapted to accommodate a preformed reflow element.

21 Claims, 6 Drawing Sheets

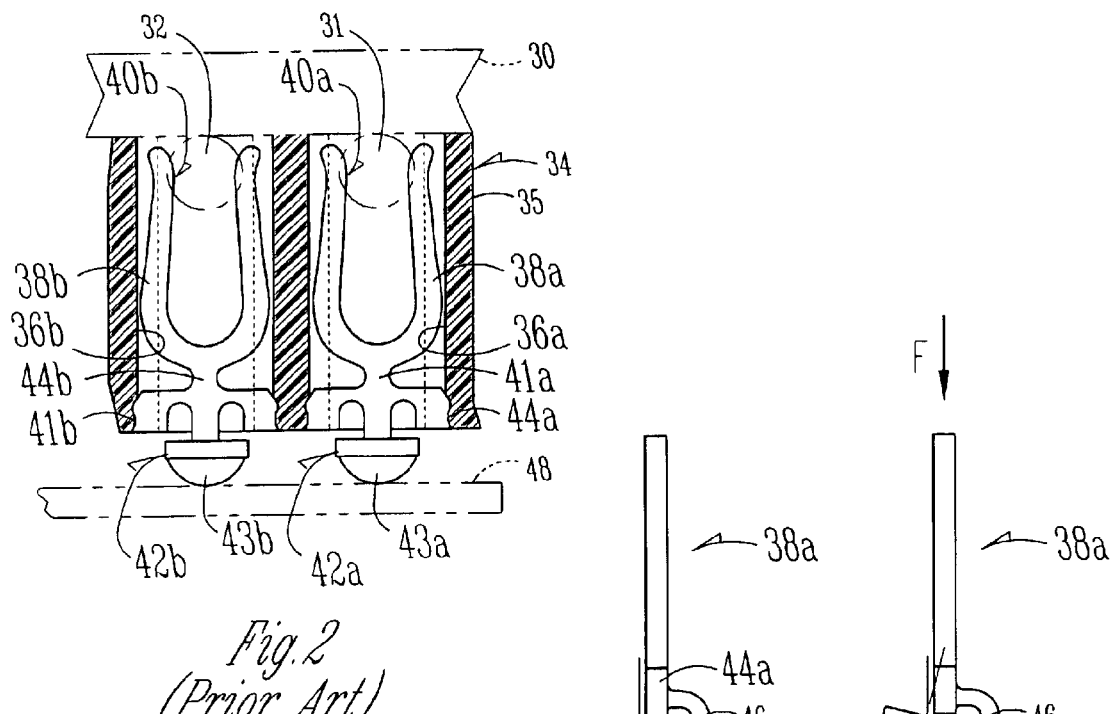
Fig. 2
(Prior Art)
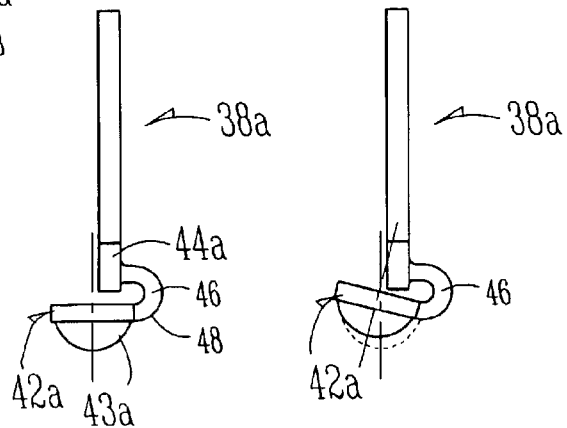
Fig. 3
(Prior Art)
Fig. 4
(Prior Art)
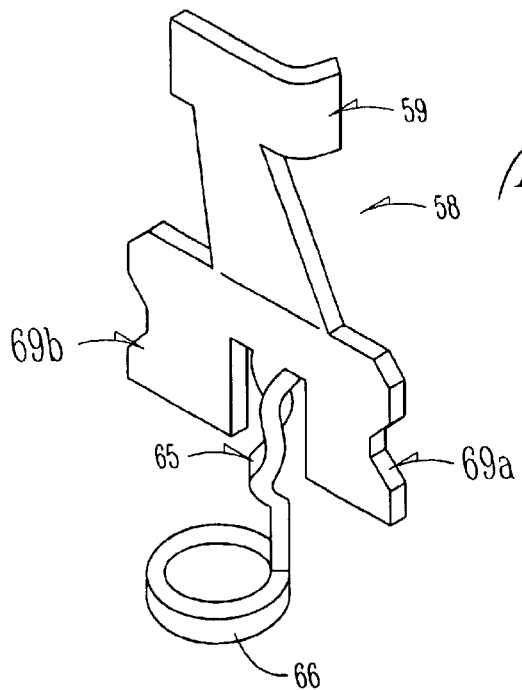
Fig. 5
(Prior Art)

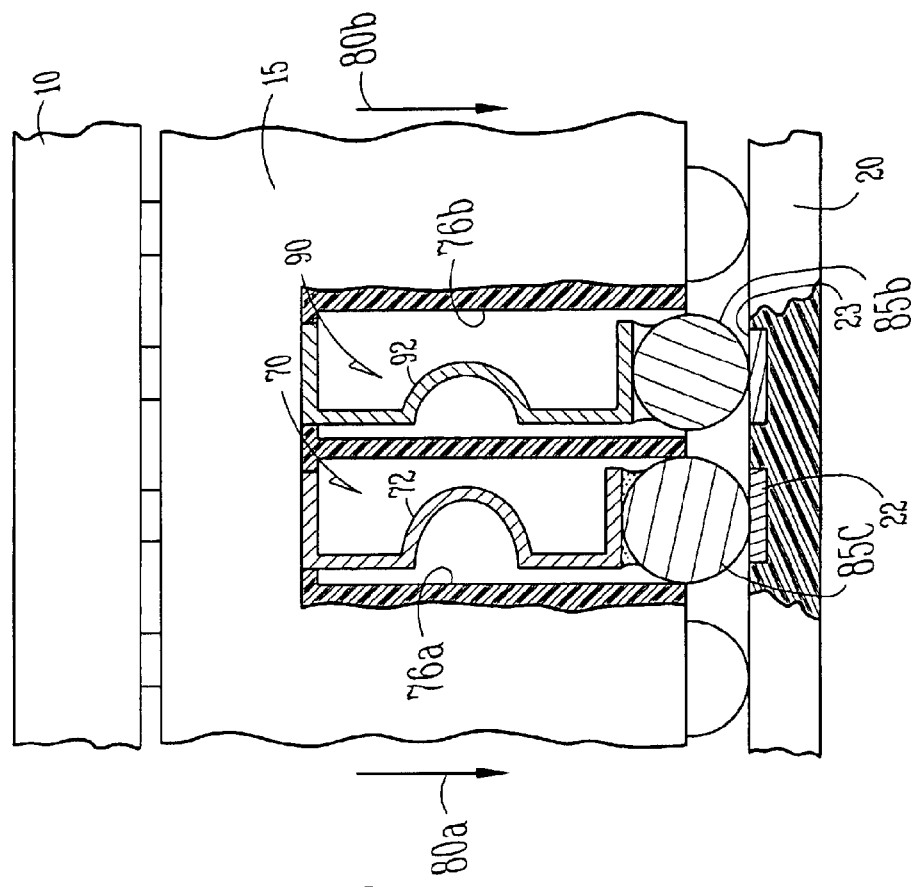
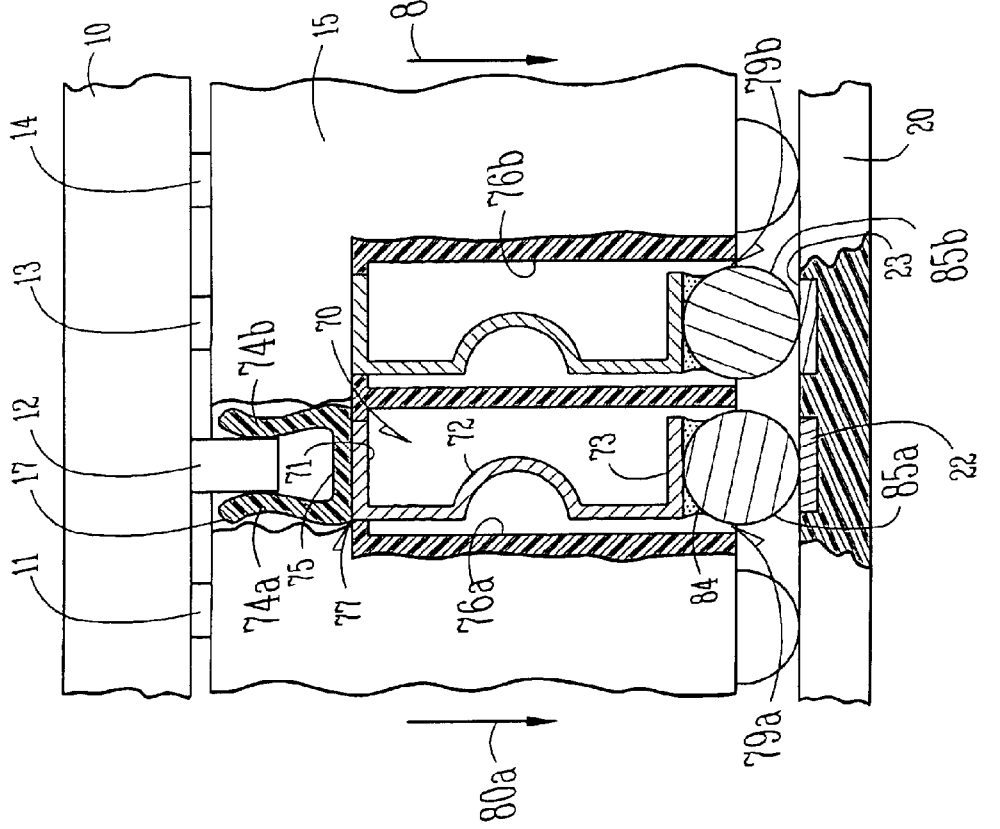

US 6,743,037 B2

SURFACE MOUNT SOCKET CONTACT PROVIDING UNIFORM SOLDER BALL LOADING AND METHOD

FIELD

The present invention is directed to a ball grid array (BGA) socket. More particularly the present invention is directed to a BGA socket that provides uniform loading of solder balls in a surface mount environment and method.

BACKGROUND

Electrical connectors/sockets may be used to secure electronic packages and/or integrated circuit (IC) devices, for example, onto a system board (e.g. a mother board or a printed circuit board "PCB") of an electronic system. These electrical sockets may be constructed for easy installation and replacement of electronic packages (e.g. electrical components) and/or IC devices, such as complex memory chips and advanced microprocessor chips. The electrical sockets may also be available in different sizes and configurations, including, for example, low-insertion force (LIF) sockets and zero-insertion force (ZIF) sockets.

A BGA socket is commonly used for mounting central processing units (CPU) to PCBs. Contacts are assembled within the socket and flux is spread over the contacts. Solder balls may then be attached to each contact via the adhesive quality of the flux on each contact. With an array of solder balls in place, the socket/solder ball array is forced against a PCB whereupon a reflow process bonds the socket to the PCB.

In order to ensure reliable electrical connection between the solder balls on the socket contacts and associated conductive pads on the PCB, the balls must be loaded against the pads by a compressive force directed along an axis normal to the plane of the circuit board. Due to the co-planarity tolerances between the plane of the balls on the socket contacts and the plane of the circuit pads on the PCB, a significant force must be applied to the socket in order to ensure that a required minimum force is applied to each of the balls. Further, as the number of balls in the array increases, the total force which must be applied is increased.

In a perfect world all of the balls of an array should be pressed into mechanical and electrical contact with a circuit pad on the PCB with a uniform force. Ideally, all solder balls would have identical diameters. However, there may be significant variability in ball diameter, which means that the solder balls having slightly larger diameters than normal must be compressed through to a point where the slightly larger balls are of the same general height of the other, more nearly normal diameter, balls. The presence of significant variability in ball diameter height has plagued the industry. This variability has required the use of compressive force to secure the socket and ball array against a PCB, often resulting in solder ball cracking at a solder ball to terminal interface.

These cracked solder balls, when exposed to a reflow process where the solder balls are heated to a molten state and then allowed to solidify, frequently produce a poor electrically conductive path between the socket contact and circuit pad of the PCB.

One approach to minimize solder ball cracking at a socket contact to PCB circuit interface is to provide a socket contact that does not include a solder ball. These solder ball-free socket contacts are provided with simulated solder ball contact structures. These structures have their own inherent problems when the simulated solder ball contacts experience uneven loading due to a lack of co-planarity of the socket to the PCB.

BRIEF DESCRIPTION OF THE DRAWINGS

The foregoing and a better understanding of the present invention will become apparent from the following detailed description of example embodiments and the claims, when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings wherein:

FIG. 2 is a cross-section of a less advantageous socket that depicts a simulated solder ball contact;

FIG. 3 is a side view of a single simulated solder ball contact of the type shown in FIG. 2;

FIG. 4 is a side view of the simulated solder ball contact of FIG. 3 that has experienced an overloading;

FIG. 5 is a perspective view of a single simulated solder ball contact;

FIG. 6 depicts an example embodiment of the invention, which includes, in partial section, features of the instant invention;

FIG. 7 depicts, in partial cross-section, an example embodiment of the invention, wherein a surface mount socket is shown accommodating solder balls of different diameters;

DETAILED DESCRIPTION OF THE PREFERRED EMBODIMENT

Figure 1:
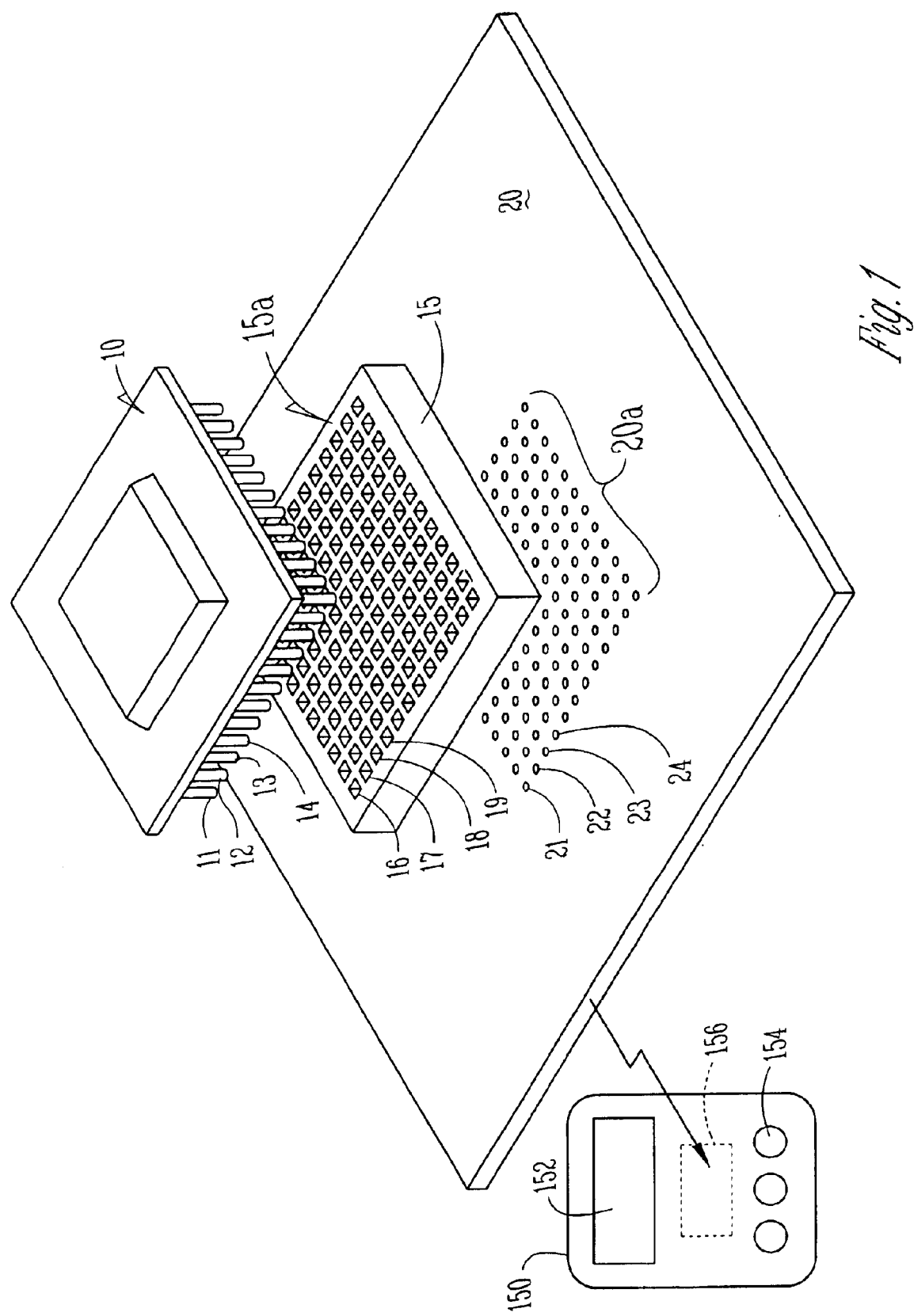
FIG. 1 is an exploded perspective view that illustrates an electronic package, a surface mount socket that includes the invention embodied therein, as well as a PCB to which the electronic package and socket are to be secured.
Figure 11:
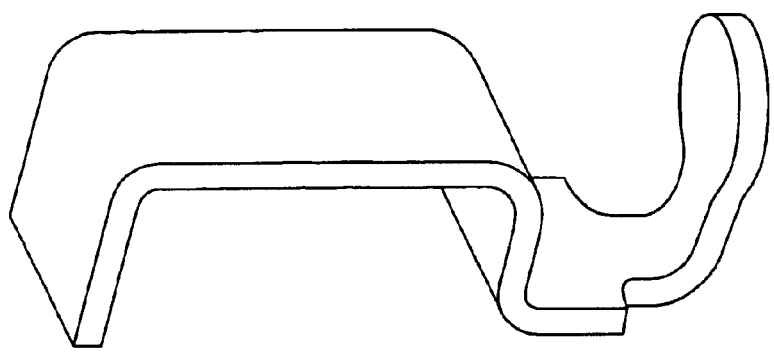
FIGS. 8, 9, 10 and 11 are perspective illustrations of a variety of socket contacts that embody the invention.
Figure 10:
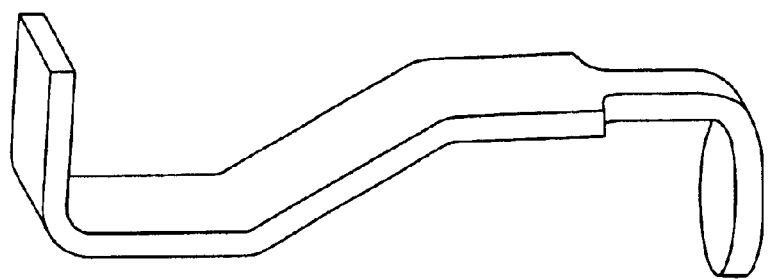
Figure 9:
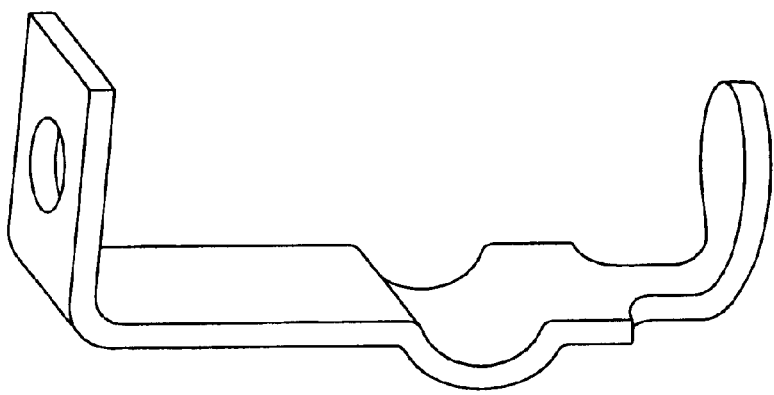
Figure 8:
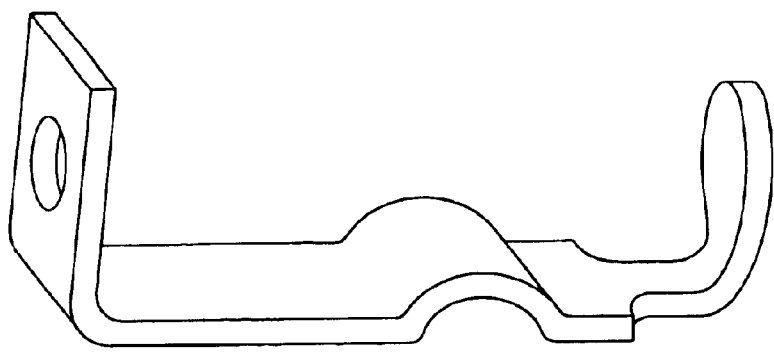

Before beginning a detailed description of the subject invention, mention of the following is in order. When appropriate, like reference numerals and characters may be used to designate identical, corresponding or similar components in differing figure drawings. It is important to note that the present invention is not limited to the examples and the example embodiments shown and described. In this regard, terms such as connector, component or socket are intended to suggest types of devices wherein the present invention finds utility. Accordingly, the term socket or connector is intended to describe a device designed to provide electrical connections and mechanical support for an electronic or electrical component requiring convenient placement. It is to be further understood that the present invention is applicable for use with all types of connectors, and all electronic packages and IC devices, including new processor chips, and any other electronic circuit technology which may become available as computer technology develops in the future. Further, the present invention is not limited to use in computer systems, but is suitable for applications in many industries and/or environments such as automotive, telecommunications, etc. However, for the sake of simplicity, discussions will concentrate mainly on exemplary use of a surface mount BGA socket for use in conjunction with system boards, mother boards, daughter boards, dual in-line memory modules (DIMMS), peripheral component interconnect (PCI) connectors, although the present invention is not limited thereto.

As a brief introduction, the instant invention avoids the problem of solder ball cracking by providing an elegantly simple socket contact arrangement that results in a uniform loading of a solder ball array prior to and during a reflow process, thereby assuring circuit contact integrity from a PCB to and through a socket to an electronic device mounted on the socket.

This invention is not only directed to a surface mount socket for a BGA but also embraces an elegantly simple socket contact structure that, when placed under a compressive load, buckles in a controlled manner. This controlled buckling establishes a highly stable, uniform, unidirectional loading of solder balls in a BGA, which ensures a crack-free union of a socket contact, solder ball and circuit of a PCB, following a reflow process.

Reference is now made to FIG. 1, which illustrates an electronic package 10 of the type that includes an array of pins/leads such as pins 11, 12, 13 and 14. A surface mount socket 15 that embodies the invention is shown disposed beneath the electronic package 10 and above a PCB 20, which may be a motherboard, system board, etc. The surface mount socket 15 shown here is but one of the many sockets/connectors, of the type described hereinbefore, in which the instant invention would find utility. The socket 15 is provided with an array of pin insertion aperture/passageway openings on an upper surface 15a, four of which (16, 17, 18 and 19) are referenced. When the package 10 is mounted on the socket 15, the pins, such as 11, 12, 13, 14 of the package 10, engage electrical contacts located in the passageway openings 16, 17, 18, and 19 of the socket 15. Although not visible in FIG. 1, an array of solder balls is positioned proximate passageway openings in the underside of the socket 15. These passageway openings correspond in their arrangement to the array of openings in upper surface 15a of the socket 15. A PCB 20 is shown with an array 20a of circuit pads, four of which (21, 22, 23 and 24) are referenced. FIG. 1 depicts an environment in which the invention finds utility. In practice, the surface mount socket 15 is secured in a reflow process, via solder balls, to the array of printed circuit pads 20a of the PCB 20. The electronic package 10 may be installed at the same time or subsequently.

The FIG. 1 system 150 and components 152, 154, 156 will be discussed ahead, near the closing portion of the disclosure.

Attention is now directed to FIG. 2, which depicts in cross-section a less advantageous socket that relies upon a simulated solder ball contact to minimize solder cracking at an interface of a socket contact and circuit pad on a PCB.

Further, reference is now made to FIGS. 2, 3 and 4 which, when taken together with the description and explanation that follows, will provide an understanding of this less advantageous simulated solder ball contact. FIG. 2 depicts an electronic package 30, shown in phantom outline, a partial section of a socket 34, and a PCB 48, shown in phantom outline. The package 30, socket 34 and PCB 48 cooperate with each other in the manner shown. The socket 34 is comprised of a dielectric housing 35 that is provided with passageways 36a, 36b that have disposed therein contacts 38a, 38b. The contacts have flared openings 40a, 40b that accommodate leads 31, 32 from the package 30. The leads 31, 32 shown in phantom outline may be of the solder ball type. The contacts 38a, 38b include a compliant section 41a, 41b and barbed sections 44a, 44b, which securely engage the walls of the passageways 36a, 36b in the manner shown. In FIG. 2 the contacts 38a, 38b includes surface mount section 42a, 42b that are provided with convex-shaped bottom sections 43a, 43b, which are intended to simulate solder balls. These convex-shaped bottom sections 43a, 43b may not be made of solder.

FIG. 3 is a side view of, for example, contact 38a, and identifies, by reference numeral 44a, the barbed section of the contact 38a that engages a wall of the passageway 36a. Barbed section 44a has physically depending there from a reverse bend 46 and right angle bend 48, which form the surface mount section 42a.

In FIG. 4 the contact 38a is shown with a force F applied downwardly on the contact 38a. It will be observed that, as the surface mount section 42a experiences increased loading and the reverse bend section 46 yields, the downward force F becomes resolved at the surface mount section 42a, by movement of the convex bottom 43a, moving off center, as shown. It follows that, should any of the contacts begin to experience this type of movement because of uneven loading, the point contact of the convex bottom 43a will shift, thereby requiring a large circuit pad size, which will intend to diminish inherent contact density on the PCB. As the need for increased pin density arises, the just described contact structure proves increasingly less advantageous, especially when the structure and function of the instant invention is compared to the just described approach.

Reference is now made to FIG. 5, which is a perspective view of another less advantageous, simulated solder ball contact 58. An upper portion 59 of the contact 58 is configured to accommodate a pin (not shown) from an electronic package (not shown). Barbed sections 69a, 69b function in the same manner as do barbed sections 44a, 44b of the contacts 38a, 38b. The simulated solder ball contact 58 distinguishes itself structurally from that shown and described in FIGS. 2, 3, and 4, in that it provides a twisted, crooked section 65 and simulated solder ball 66, that experiences a similar shifting of the simulated solder ball contact under socket/contact loading, similar to what was just noted in the socket/contact structure of FIG. 2.

Attention is now directed to FIG. 6, which illustrates, in a partial cross-section, an example embodiment of the invention. FIG. 1 illustrates an exploded perspective view of an electronic package 10, surface mount socket 15 and a PCB 20. In FIG. 6 the socket 15 and PCB 20 are shown in partial section. It follows then that the electronic package 10, with its pins 11, 12, 13, 14, are shown fitted into passageway openings/apertures, one of which (17) is shown in partial section in FIG. 6. A contact 70, that embodies the invention, includes an upper end 71, an intermediate section 72, and a lower end 73. More specifically the upper end 71 is adapted to be secured to the flexible finger contacts 74a, 74b, which are integral with a flexible finger contact base 75. The intermediate section 72 may have a buckle-shaped, a C-shaped, etc. configuration, as shown in this figure. The intermediate section 72 is designed to flex under a compressive load. The lower end 73 of the contact 70 is configured to allow a pre-formed solder element, here shown as a solder ball 85a, to be secured by a medium such as solder paste 84, to the lower end 73. The socket 15 includes passageways 76a, 76b, in which the contacts embodying the invention are housed. The contact 70 is shown secured at its upper end 71, at point 77, to a wall of the passageway 76a. The passageways 76a, 76b establish openings 79a, 79b, where the passageways exit the socket 15. It should be apparent in this figure that the solder ball travel is limited to the distance the solder ball extends beyond the socket 15, when the socket 15 and solder ball 85a, 85b are forced (see unidirectional force arrows 80a, 80b) into contact with the PCB 20, prior to a reflow process that will secure the socket 15 via reflow solder from solder balls 85a, 85b to circuit pads 22, 23 of the PCB 20.

By way of summary, observe that in this embodiment of the invention, the lower end 73 of the contact 70 is located proximate to the opening 79a in the socket 15 and the intermediate section 72 and lower end 73 are free from binding contact with the passageway wall 76a, thereby allowing the contact intermediate section 72 and lower end 73 to move relative to the passageway 76a, when the socket 15 is forced into contact with the PCB. The contact intermediate section 72 and lower end 73 cooperate with the passageway 76a to provide a uniform, unidirectional force loading on the solder ball 85a to thereby ensure a crack-free solder ball union with, for example, the contact lower end 73 and a circuit pad, such as, pad 22 of the PCB.

Further, it is noted that compressive inward movement of the lower end 73 into the passageway 76a constrains the lower end from any side-to-side or skewed shifting of a ball/pad contact point. That is, an axial alignment of the contact ball can be maintained with respect to an axis of main (longitudinal) body portions of the contact 70, and there is substantially no axial distortion resultant from the buckling. As side-to-side displacement or distortion is prevented, a ball and pad density can be advantageously increased over that of the disadvantageous FIGS. 2–4 arrangement.

Attention is now directed to FIG. 7, where the contact arrangements described and explained with respect to FIG. 5 are illustrated in a highly exaggerated manner. This exaggerated illustration is intended to depict a situation that arises when a variability in solder ball diameter is experienced. In FIG. 7 the solder ball 85c is shown having a diameter larger than a normal solder ball, namely solder ball 85b. The force arrows 80a, 80b in FIGS. 6 and 7 indicate the direction in which an external force is applied to the surface mount socket 15. As in FIG. 6, the passageways 76a, 76b have contacts 70 and 90 positioned as shown. It will be observed that as the surface mount socket 15 and the oversized solder ball 85c and normal sized solder ball 85b are forced against the circuit pads 22, 23 of the PCB 20, the downward movement of the socket 15 causes the force experienced by the oversized solder ball 85c to be reacted into the contact 70, whereupon the buckle-shaped, intermediate section 72 flexes, as shown, to accommodate the load the oversized solder ball experiences. The contact 90 and its normal sized solder ball 85b experience a force loading similar to that being experienced by the oversized solder ball 85c. It should be readily apparent that the just described socket/contact arrangement ensures a uniform, compressive load force to be transmitted from the socket 15 through the intermediate flex sections 72, 92 to the solder balls 85c, 85b, while simultaneously limiting the solder balls' 85c, 85b travel in the passageways 76a, 76b to the distance the solder balls 85c, 85b extend beyond the socket 15, when the socket and different sized solder balls 85c, 85b are forced into contact with a circuit board, prior to a reflow process that will secure the socket 15 via reflow solder to the circuit pads 22, 23 of the PCB 20.

Attention is now directed to FIGS. 8, 9, 10 and 11, which illustrate four (4) ways a buckling point can be introduced in a socket contact that embodies the invention. The purpose of these illustrations is to show a multitude of contact structures that may be utilized to provide the needed flexing of an intermediate section of a socket contact that embodies the invention. It is to be understood that there may be many other configurations and variations of contact structures that would find utility in the practice of the invention and these other configurations are intended to fall within the purview of the appended claims.

Figure 12:
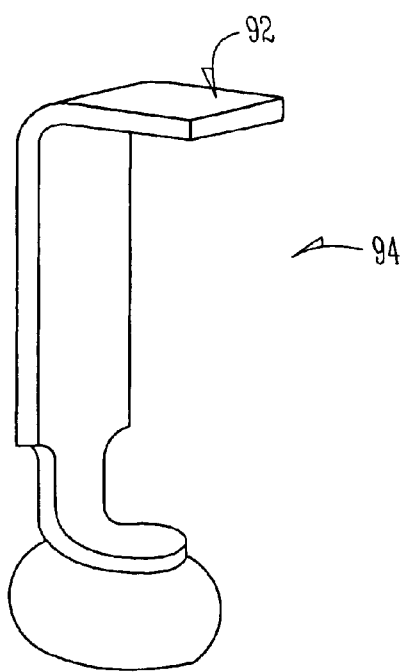
FIG. 12 is a perspective view of a surface mount socket contact with a solder ball secured thereto.
Figure 13:
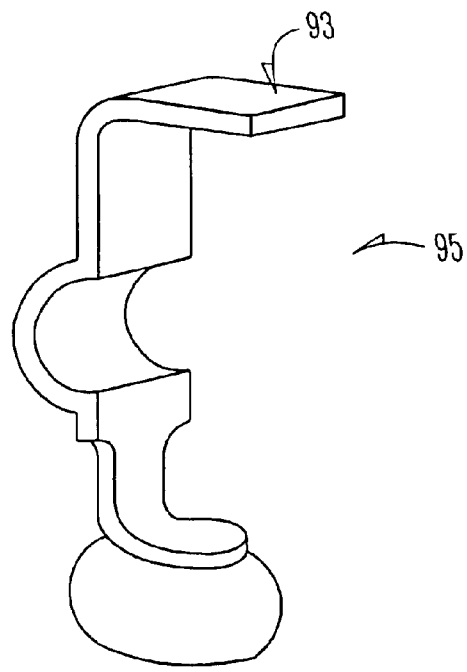
FIG. 13 is a perspective view of one embodiment of the invention and illustrates a socket contact with a buckle point configuration and a solder ball secured thereto.
Figure 14:
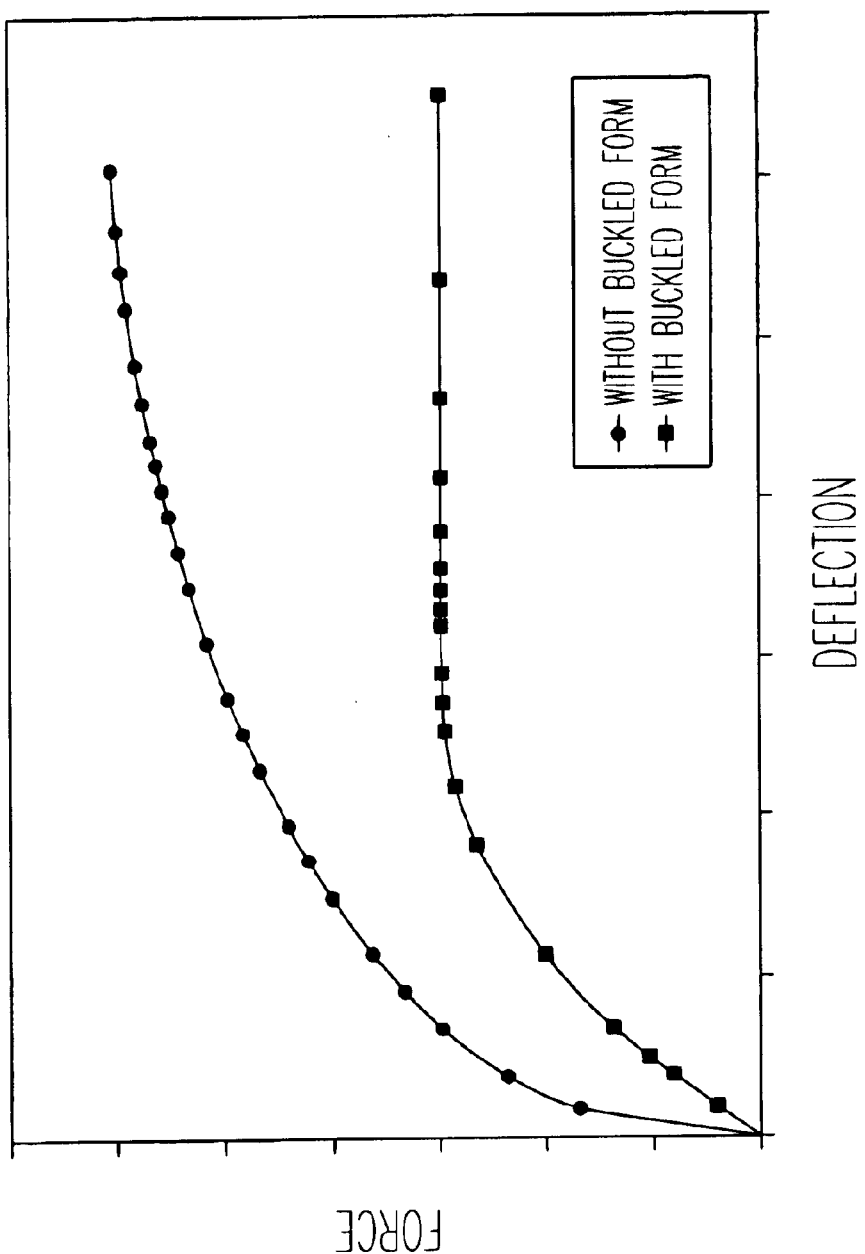
FIG. 14 is a graph that depicts force applied to a socket, with and without a buckle form of the present invention.

Turning now to FIGS. 12, 13, 14 which, when studied together with the explanation that follows, will provide graphic evidence of the remarkable utility of the subject invention.

FIG. 12 is a perspective illustration of a socket contact 94 without a buckling point and includes an unreferenced solder ball secured to a lower end thereof. FIG. 13 depicts a socket contact 95 that includes a buckle point and an unreferenced solder ball secured at a lower end thereof.

Actual tests of the efficacy of the instant invention will now be described. The contacts 94, 95 were placed in a test fixture in a manner that restrained all movement of the solder balls at the lower ends of the contacts. The top faces 92, 93 of the socket contacts 94, 95 were displaced in a downward, vertical direction to simulate the compressive loading that would arise in a solder ball secured at the lower end of the contact. FIG. 14 depicts the force deflection curves that arise from the socket contact structures of FIGS. 12, 13, when the contacts have been force loaded in the manner just described. A close examination of the graph of FIG. 14 reveals that the socket contact with a buckling point experiences a much lower force for the same deflection, indicating the increase in the compliance due to presence of the buckling point. These just described tests revealed that there is about a 75% reduction in the equivalent plastic strain in the buckled point contact case as compared to the contact without the buckle. The addition of the contact buckling point lowers the plastic strain energy in the solder ball from 0.36 to 0.088, which is a decrease of about 4 times. It follows therefore that addition of a buckling feature of the type described hereinbefore will drastically reduce the chances of solder ball cracking at the solder ball to terminal interface.

In the broadest sense, the present invention involves a method that may include the following:

forming a contact that includes an upper end adapted to receive an electrical contact, a flexible intermediate section adapted to flex under a compressive load, and a lower end adapted to accommodate a preformed solder element, providing a socket that has at least one passageway therein, securing the upper end of the contact in the passageway, such that the contact intermediate section and the lower end are free from binding contact with the wall of the passageway and the contact lower end is proximate to a passageway opening in the socket, and securing a solder element to the contact lower end.

forcing the socket and solder element into contact with a circuit board to cause the contact lower end and flexible intermediate section to flex and move relative to the passageway to thereby provide a uniform, unidirectional force loading on the solder element to thereby ensure a crack-free solder element union with the contact lower end and a circuit of the circuit board, subsequent to a reflow process of the socket/solder element/circuit board.

Returning to FIG. 1, illustrated is an example system embodiments, e.g., a hand-held personal digital assistant (PDA) 150 that may incorporate contact and/or socket embodiments of the present invention. Such an example system may further include an output device 152 (e.g., a display) as well as an input device 154 (e.g., user buttons).

In concluding, reference in the specification to an example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures, however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of the invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, the electrical contacts of the pin insertion apertures of component packages may be available in a variety of sizes and shapes with different projections. Cam mechanisms may be included and may include different driving elements, such as worn gears, wedges, ratchets, etc. for insuring, for example, finger/pin engagement. Moreover, the camshaft of the cam mechanism may be positioned at various angles and may work with different sizes and/or shaped levers. The overall dimensions of the surface mount socket/connector may be altered, depending upon the electrical elements used, the desired strength, the structural rigidity, and thermal stability. Further, contact bodies may be made of any type of conductive, rigid material, e.g., metal, conductive plastic (e.g., conductive polymer), etc. Still further, any reflow element at an end of the contact bodies may be made of any type of reflow, rigid material, e.g., solder, conductive plastic (e.g., conductive polymer), etc.

Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A surface mount socket comprising:
   at least one contact therein, the contact having an upper end, an intermediate section, and a lower end;
   wherein the upper end is adapted to receive an electrical contact, whereas the intermediate section is adapted to flex under compressive load, and the lower end is adapted to accommodate a preformed reflow element secured thereto and wherein when a reflow element is in place:
   a compressive load force may be transmitted from the socket through the intermediate flex section to the reflow element; and
   the reflow element travel is limited to the distance the reflow element extends beyond the socket when the reflow element contacts with a substrate prior to a reflow process to secure the socket, via reflow, to the substrate.

2. The socket as claimed in claim 1, wherein the preformed reflow element is one of a solder ball and a plastic conductive ball.

3. The socket as claimed in claim 2, wherein the contact is in a passageway that at one end thereof is adapted to connect to an electrical contact of an external device, whereas the other end of the passageway forms an opening in a socket surface that will be juxtaposed to a substrate.

4. The socket as claimed in claim 3, wherein the upper end of the contact in the passageway is secured to the socket.

5. The socket as claimed in claim 4, wherein the lower end of the contact is located proximate to the opening in the socket and the contact intermediate section and lower end are free from a binding contact with a passageway wall, allowing the contact intermediate section and lower end to move relative to the passageway when the socket is forced into contact with the substrate, the contact intermediate section and lower end cooperating with the passageway to provide a uniform, unidirectional force loading on the reflow element to thereby ensure a crack-free reflow element union with the contact lower end and a circuit of the substrate.

6. The socket as claimed in claim 5, wherein the contact intermediate section has a buckled shaped configuration.

7. The socket as claimed in claim 5, wherein the overall configuration of the contact upper end, intermediate section, and lower end has a Z shape.

8. The socket as claimed in claim 5, wherein the overall configuration of the contact upper end, intermediate section, and lower end has an S shape.

9. A surface mount socket comprising:
   at least one contact therein, the contact having an upper end, an intermediate section, and a lower end;
   wherein the upper end is adapted to accommodate an electrical contact, whereas the intermediate section is adapted to flex under compressive load, and the lower end remains within the socket and is adapted to accommodate a preformed solder element secured thereto wherein when a solder element is in place:
   only a portion of the element extends beyond the socket; ensuring a uniform compressive load force transmitted from the socket through the intermediate flex section to the solder element;
   while simultaneously limiting the solder ball travel to the distance the solder element extends beyond the socket;
   when the socket and solder element are forced into contact with a circuit board;

prior to a reflow process that secures the socket, via reflow solder, to the circuit board.

10. The socket as claimed in claim 9, wherein the preformed solder element is a solder ball.

11. The socket as claimed in claim 10, wherein the contact is in a passageway having at least one opening in a lower surface of the socket.

12. The socket as claimed in claim 11, wherein the upper end of the contact in the passageway is secured to the socket.

13. The socket as claimed in claim 12, wherein the passageway extends to an upper socket surface to provide an upper surface passageway opening that is adapted to receive a pin that is coupled to the upper end of the contact to provide an electrical connection to the pin.

14. The socket as claimed in claim 13, wherein the lower end of the contact extends from the intermediate section to a point proximate to the opening in the lower surface, the contact intermediate section and lower end are free from a binding contact with the passageway wall, allowing the contact intermediate section and lower end to move relative to the passageway when the socket is forced into contact with the circuit board, the contact intermediate section and lower end cooperating with the passageway to provide a unidirectional force loading on the solder ball to thereby ensure a crack-free solder ball union with the contact lower end a circuit of the circuit board.

15. The socket as claimed in claim 14, wherein the contact intermediate section has a buckled shaped configuration.

16. The socket as claimed in claim 14, wherein the overall configuration of the contact upper end, intermediate section, and lower end has a Z shape.

17. The socket as claimed in claim 14, wherein the overall configuration of the contact upper end, intermediate section, and lower end has an S shape.

18. A contact for a surface mount socket, the contact comprising:

an upper end, an intermediate section, and a lower end, the upper end is adapted to receive an electrical contact, whereas the intermediate section is adapted to flex under compressive load, and the lower end is adapted to accommodate a preformed reflow element secured thereto, wherein, when a reflow element is in place:

a compressive load force may be transmitted from the socket through the intermediate flex section to the reflow element; and reflow element travel is limited to the distance the reflow element extends beyond the socket:

when the reflow element contacts with a substrate;

prior to a reflow process secures the socket, via reflow, to the substrate.

19. The contact as claimed in claim 18, wherein the contact is made of one of at least a metal material and a plastic conductive material.

20. An electronic system comprising:

at least one of an input device and output device; and a surface mount socket including:

at least one contact therein, the contact having an upper end, an intermediate section, and a lower end, the upper end is adapted to receive an electrical contact, whereas the intermediate section is adapted to flex under compressive load, and the lower end is adapted to accommodate a preformed reflow element secured thereto, wherein, when a reflow element is in place:

a compressive load force may be transmitted from the socket through the intermediate flex section to the reflow element; and reflow element travel is limited to the distance the reflow element extends beyond the socket:

when the reflow element contacts with a substrate;

prior to a reflow process secures the socket, via reflow, to the substrate.

21. The electronic system as claimed in claim 20, wherein the contact is made of one of at least a metal material and a plastic conductive material.

* * * * *